US009379238B2

(12) United States Patent
Larrieu (10) Patent No.: US 9,379,238 B2
(45) Date of Patent: Jun. 28, 2016

(54) PROCESS FOR FABRICATING A FIELD-EFFECT TRANSISTOR DEVICE IMPLEMENTED ON A NETWORK OF VERTICAL NANOWIRES, THE RESULTING TRANSISTOR DEVICE, AN ELECTRONIC DEVICE COMPRISING SUCH TRANSISTOR DEVICES AND A PROCESSOR COMPRISING AT LEAST ONE SUCH DEVICE

(75) Inventor: Guilhem Larrieu, Baziege (FR)

(73) Assignee: CENTRE NATIONAL DE LA RECHERCHE SCIENTIFIQUE (C.N.R.S.), Paris (FR)

( * ) Notice: Subject to any disclaimer, the term of this patent is extended or adjusted under 35 U.S.C. 154(b) by 49 days.

(21) Appl. No.: 13/989,509

(22) PCT Filed: Nov. 24, 2011

(86) PCT No.: PCT/EP2011/070979
§ 371 (c)(1),
(2), (4) Date: May 24, 2013

(87) PCT Pub. No.: WO2012/069606
PCT Pub. Date: May 31, 2012

(65) Prior Publication Data
US 2013/0240983 A1 Sep. 19, 2013

(30) Foreign Application Priority Data
Nov. 26, 2010 (FR) ..................................... 10 59802

(51) Int. Cl.
*H01L 29/78* (2006.01)
*C01B 31/02* (2006.01)
*B82Y 10/00* (2011.01)
*B82Y 40/00* (2011.01)
*H01L 29/06* (2006.01)
*H01L 29/423* (2006.01)

(Continued)

(52) U.S. Cl.
CPC ............. *H01L 29/7827* (2013.01); *B82Y 10/00* (2013.01); *B82Y 40/00* (2013.01);
(Continued)

(58) Field of Classification Search
CPC .................................................. H01L 21/02606
See application file for complete search history.

(56) References Cited

U.S. PATENT DOCUMENTS 7,446,025 B2 11/2008 Cohen et al.
2003/0189202 A1 10/2003 Li et al.

(Continued)

FOREIGN PATENT DOCUMENTS

CN 101 399 207 4/2009
EP 1482562 12/2004

(Continued)

OTHER PUBLICATIONS

International Search Report dated May 21, 2012, corresponding to PCT/EP2011/070979.

(Continued)

*Primary Examiner* — Mohammad Choudhry
(74) *Attorney, Agent, or Firm* — Young & Thompson (57) ABSTRACT

A process for fabricating a field-effect transistor device (20) implemented on a network of vertical nanowires (24), includes: producing a source electrode (26) and a drain electrode (30) at each end of each nanowire (24) symmetrically relative to the gate electrode of each elementary transistor implemented on a nanowire; creating a gate electrode by depositing a layer (38) of conductive material around a layer (36) of dielectric material that surrounds a portion of each nanowire (24), a single conductive layer (38) being used for all of the nanowires and the thickness of the conductive layer corresponding to the gate length of the transistor device; and insulating each electrode with a planar layer (32, 34) of a dielectric material in order to form a nanoscale gate and in order to insulate the contacts of each elementary transistor between the gate and the source and the gate and the drain.

7 Claims, 9 Drawing Sheets

(51) Int. Cl.
*H01L 29/66* (2006.01)
*H01L 29/775* (2006.01)
*H01L 21/02* (2006.01)

(52) U.S. Cl.
CPC ....... *C01B 31/0206* (2013.01); *H01L 29/0665* (2013.01); *H01L 29/0676* (2013.01); *H01L 29/4232* (2013.01); *H01L 29/66439* (2013.01); *H01L 29/66666* (2013.01); *H01L 29/775* (2013.01); *H01L 21/02606* (2013.01); *Y10S 977/762* (2013.01); *Y10S 977/938* (2013.01)

(56) References Cited

U.S. PATENT DOCUMENTS

| | | |
|---|---|---|
| 2004/0262681 A1 | 12/2004 | Masuoka et al. |
| 2006/0273389 A1 | 12/2006 | Cohen et al. |
| 2008/0230802 A1 | 9/2008 | Bakkers et al. |
| 2010/0117138 A1 | 5/2010 | Huerta et al. |
| 2011/0012085 A1 | 1/2011 | Deligianni et al. |

FOREIGN PATENT DOCUMENTS

| | | |
|---|---|---|
| EP | 1 804 286 | 7/2007 |
| JP | 2004-356314 | 12/2004 |
| JP | 2006-332662 | 12/2006 |
| JP | 2007-036267 | 2/2007 |
| JP | 2007-520877 | 7/2007 |
| WO | 2004/040667 | 5/2004 |
| WO | 2005-064664 | 7/2005 |
| WO | 2007/090814 | 8/2007 |
| WO | 2008/118084 | 10/2008 |

OTHER PUBLICATIONS

JP Office Action, dated Sep. 8, 2015; Application No. 2013-540371.

PROCESS FOR FABRICATING A FIELD-EFFECT TRANSISTOR DEVICE IMPLEMENTED ON A NETWORK OF VERTICAL NANOWIRES, THE RESULTING TRANSISTOR DEVICE, AN ELECTRONIC DEVICE COMPRISING SUCH TRANSISTOR DEVICES AND A PROCESSOR COMPRISING AT LEAST ONE SUCH DEVICE

BACKGROUND OF THE INVENTION

1. Field of the Invention

The present invention relates to a process for fabricating a field-effect transistor device implemented on a network of vertical nanowires, including a plurality of elementary transistors, each elementary transistor comprising a source electrode and a drain electrode each positioned at one end of a vertical nanowire of the network and connected by a channel and each elementary transistor including a gate electrode surrounding each vertical nanowire of the network, the drain, source and gate electrodes of the elementary transistors implemented on the nanowires are respectively connected to each other so as to form unique drain, source and gate electrodes of the transistor device.

The invention also relates to an electronic device comprising such transistor devices, and a processor comprising at least one such electronic device.

The development of microelectronics is based on the sizing of transistor devices, which, in addition to saving space, makes it possible to improve the performance of the devices.

Nevertheless, the sizing, i.e., the decrease in the dimensions, in particular the length of the gate of a transistor, creates difficulties in the production of said devices, research and development costs, and technological complexity, as well as limitations associated with the very physics of the devices. For example, the miniaturization of the gate of a transistor causes a control loss of the channel of the transistor, also called short channel effects, which deteriorates the performance of said transistor devices, for example by causing a high leakage current, a shift of the threshold voltage, etc., and destroys the inherent benefits of miniaturization.

2. Description of the Related Art

Thus, new gate architectures have been introduced to resolve this problem while improving the electrostatic control of the channel, using multi-gates.

It is known that the optimal electrostatic configuration is generated by a so-called "surrounding" gate around a small volume element of the semiconductor, for example a gate around a nanowire. The nearly perfect control of the short channel effects makes it possible in particular to demonstrate very low leakage currents for nanoscale gate lengths.

Nevertheless, the control current, i.e., the current passing through the transistor in the on state, remains low, as it is limited by the small cross-section of the nanowire. It is therefore crucial not to implement a transistor on a single wire or nanowire, but on a network of nanowires so as to combine excellent electrostatic control with a high current level in the on state.

Transistors can be integrated on horizontal or vertical networks. Horizontal networks are difficult to produce on large scales as they require stacking many layers and integrating transistor devices on those networks is even more complex: there are difficulties in defining a nanoscale gate on the different layers, difficulties in doping the source/drain areas, etc.

Vertical integration makes it possible to eliminate these problems. In fact, the dense networks are easier to produce using the top-down approach (etching) and the bottom-up approach (growth).

The production of nanoscale gates does not require a critical lithography step, for example electronic lithography, since the gate length is simply defined by the thickness of the deposited layer of the gate material.

The field-effect transistor devices implemented on a vertical nanowire network nevertheless have difficulties, for example in producing source (or drain) contacts at the bottom (or at the top) of the transistors, controlling parasitic gate/source-drain overlap capacitances, to produce sources/drains auto-aligned on the gate or to produce layers of insulating material, also called insulating spacers, between the source or the drain and the gate, the thickness and flatness of which must be controlled so as to ensure good control of parasitic overlap capacitances and to be able to reduce the gate length.

Documents US 2003/0189202 and U.S. Pat. No. 7,446,025 describe processes for fabricating field-effect transistor devices implemented on a network of vertical nanowires.

Nevertheless, these processes are relatively complex. In fact, they in particular comprise a step for forming a conductive layer for contact of the bottom on which catalysts are located to produce growth of the network of nanowires. However, it is known by those skilled in the art that it is extremely difficult to be able both to vertically grow nanowires with good reproducibility on a metal or silicide (i.e., without benefiting from the crystalline directions of the substrates) and to ensure good temperature resistance of the metal materials.

Furthermore, US 2003/0189202 does not describe a field-effect transistor device.

Additionally, the field-effect transistor device described in U.S. Pat. No. 7,446,025 does not have optimized capacities, since the insulation between the source (bottom contact) and the gate consists of the gate insulation, therefore with a small thickness causing extremely high source/gate coupling capacities.

Other processes for fabricating FET devices on networks of vertical nanowires are described in the literature. For example, M. Egard et al. in the article "*Vertical InAs Nanowire Wrap Gate Transistors with $f_t$>7 GHz and $f_{max}$>20 GHz*", NanoLetters, 10(3), pp. 809-812, 2010, uses an architecture presented by C. Thelander et al. in the article entitled "*Development of a Vertical Wrap-Gated InAs FET*", IEEE Trans. on Elec. Dev., 55(11), pp 3030-3036, November 2008], V. Schmidt et al. in the article "*Realization of a Silicon Nanowire Vertical Surround-Gate Field-Effect Transistor*", Small, 2(1), pp 85-88, January 2006 or by T. Tanaka et al. in the article entitled "*Vertical Surrounding Gate Transistors Using Single InAs Nanowires Grown on Si Substrates*" Appl. Phys. Express 3, 025003, 2010, which describe a process in which the topology of the gate is produced with a noticeable wave effect, greater than 50 nm, thereby preventing the miniaturization of the gate length while introducing parasitic capacitances between part of the gate and the nanowire. This wave phenomenon is inherent to the topology of the spacer insulation, which, in the vicinity of the nanowire, causes a rising or descending wave depending on the embodiment.

BRIEF SUMMARY OF THE INVENTION

The invention therefore aims to significantly simplify the fabrication of the transistor devices implemented on a network of vertical nanowires, to be able to decrease their dimensions to nanoscale regimes and to minimize the excess resistances of the source and drain areas as well as the overlap capacitances.

The invention therefore aims to propose transistors having a low access resistance as well as low overlap capacitances.

To that end, the invention relates to a fabrication process of the aforementioned type, characterized in that it comprises the following steps:

producing source and drain electrodes at each end of each vertical nanowire, the source and drain electrodes being positioned symmetrically with respect to the gate electrode of each elementary transistor implemented on a nanowire;

creating a gate electrode by depositing a layer of dielectric material surrounding a portion of each nanowire and depositing a layer of conductive material around each layer of dielectric material surrounding the portion of each nanowire, the layer of conductive material being unique for all of the nanowires of the network and the thickness of the layer of conductive material corresponding to the length of the gate of the transistor device; and insulating each electrode using a planar layer of a dielectric material so as to form a nanoscale gate and insulate the contacts between the source and the gate and between the drain and the gate of each elementary transistor implemented on a nanowire.

According to other embodiments, the fabrication process comprises one or more of the following features, considered alone or according to all technically possible combination(s):

the source and drain electrodes are positioned symmetrically with respect to the gate electrode using an autoalignment process of the source and drain electrodes on the gate electrode of the transistor implemented around a nanowire;

the step for insulating each source and drain electrode using the dielectric is done by depositing a first layer of dielectric material and a second layer of dielectric material, the layer of conductive material creating the gate electrode being deposited above the first layer of dielectric material and the second layer of dielectric material being deposited above the layer of conductive material creating the gate electrode, the thickness of the first and second layers of dielectric material and the position of the layer of conductive material creating the gate electrode being predefined so that the source and drain electrodes are positioned symmetrically with respect to the gate electrode of the transistor implemented on a nanowire;

the flatness of the first layer of dielectric material is defined with a precision substantially less than or equal to 5 nm;

the dielectric material of the first and second layers of dielectric material is a fluent inorganic resin;

the thickness of the layer of conductive material creating the gate electrode is smaller than 20 nm, the thickness of the layer defining the length of the gate.

The invention also relates to a field-effect transistor device implemented on a network of vertical nanowires including a plurality of elementary transistors, each elementary transistor comprising a source electrode and a drain electrode each positioned at one end of a vertical nanowire of the network and connected by a channel and each elementary transistor including a gate electrode surrounding each vertical nanowire of the network, the drain, source and gate electrodes of the elementary transistors implemented on the nanowires are respectively connected to each other so as to form unique drain, source and gate electrodes of the transistor device, the transistor device being characterized in that:

the source and drain electrodes are positioned symmetrically with respect to the gate electrode of each transistor implemented on a nanowire;

the gate electrode of a transistor is formed by a layer of dielectric material surrounding a portion of each nanowire and a layer of conductive material around each layer of dielectric material surrounding the portion of each nanowire, the layer of conductive material being unique for all of the nanowires of the network and the thickness of the layer of conductive material corresponds to the length of the gate of the transistor device; and the device includes a dielectric material so as to insulate each source and drain electrode to form the contacts between the source and gate and between the drain and gate of each transistor implemented on a nanowire.

According to other embodiments, the transistor device comprises one or more of the following features, considered alone or according to all technically possible combinations:

the gate length of the transistor is less than 20 nm;

the nanowires are made of a material from group IV or groups III-V according to the periodic table of elements;

the nanowires are made from silicon;

the conductive material creating the gate electrode is made from metal, silicide, silicon or polysilicon;

the dielectric material surrounding a portion of each nanowire is made from silicon dioxide $SiO_2$ or an insulating material having a high dielectric coefficient among aluminum-, zirconium-, hafnium-, gadolinium-, or lanthanum-based oxides.

Thus, the field-effect transistor device implemented on a network of vertical metal wires according to the invention makes it possible to optimize the bottom and top contacts, called source/drain, so as to obtain a low access resistance as well as low parasitic overlap capacitances and nanoscale gate definitions.

The invention also relates to an electronic device characterized in that it comprises at least one device with a plurality of field-effect transistors implemented on a network of vertical nanowires as defined above.

According to other embodiments, the electronic device belongs to the group consisting of: a CMOS inverter, a logic circuit, a multiplexer, a volatile memory, a non-volatile memory, and a device for detecting gas or biochemical agents.

The invention also relates to a processor characterized in that it includes at least one electronic device as defined above.

BRIEF DESCRIPTION OF THE DRAWINGS

The invention and its advantages will be better understood upon reading the following description, provided solely as an example and done in reference to the appended drawings, in which:

FIGS. 1 and 2 show a field-effect transistor 2 (FED implemented on a vertical nanowire 4.

DETAILED DESCRIPTION OF THE PREFERRED EMBODIMENTS

Figure 1:
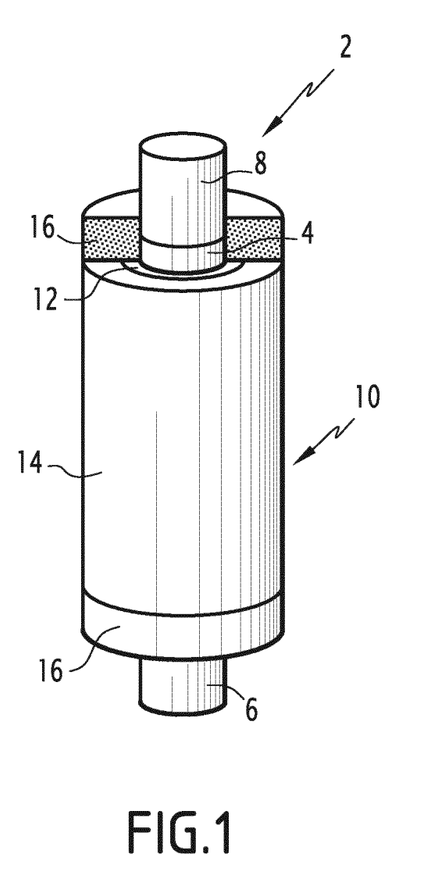
FIGS. 1 and 2 are respectively profile and cross-sectional diagrammatic illustrations of a field-effect transistor integrated on a vertical nanowire according to the invention.
Figure 2:
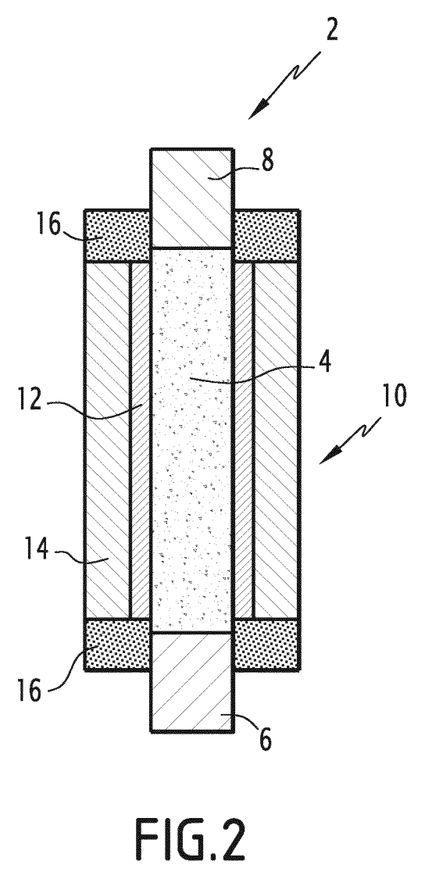

The material making up the nanowire is from group IV (Si, Ge, etc.) or combined materials such as groups III-V (InAs, GaAs, InP, GaSb, etc.) according to the periodic table of elements, and the nanowire is made in a known manner using a bottom-up (growth) or top-down (etching) approach.

In a known manner, the transistor 2 is a semiconductor device including three active electrodes: a source 6, a drain 8 and a gate 10. Such a transistor makes it possible to control the passage of a current between the source 6 and the drain 8 using a control electrode: the gate 10.

In a known manner, the gate 10 is made up of a stack of the metal oxide semiconductor (MOS) type including a first layer 12 made up of a so-called gate dielectric surrounding the nanowire 4 and a second layer 14 made up of a so-called gate conductor, preferably a metal, surrounding the first layer 12.

The gate conductor making up the second layer 14 is made up of any conductive material such as a metal, silicide or polysilicon.

Depending on the material used for the nanowires, the gate dielectric of the first layer 12 is a material with a high dielectric constant, for example $HfO_2$, $ZrO_2$, $Al_2O_3$, $Gd_2O_3$, etc. (and all of their compounds) deposited using atomic layer deposition (ALD) or chemical vapor deposition (CVD) or, if the nanowire is made from silicon, an oxide, for example $SiO_2$, SiON, grown thermally or a material with a high dielectric constant.

The gate has nanoscale dimensions; for example, its length is substantially comprised between 0.1 nm and 30 nm, and the thickness of the dielectric is substantially comprised between 0.1 nm and 10 nm.

The electrostatic control of the channel made up of the nanowire is ensured by the nanoscale surrounding gate.

Figure 3:
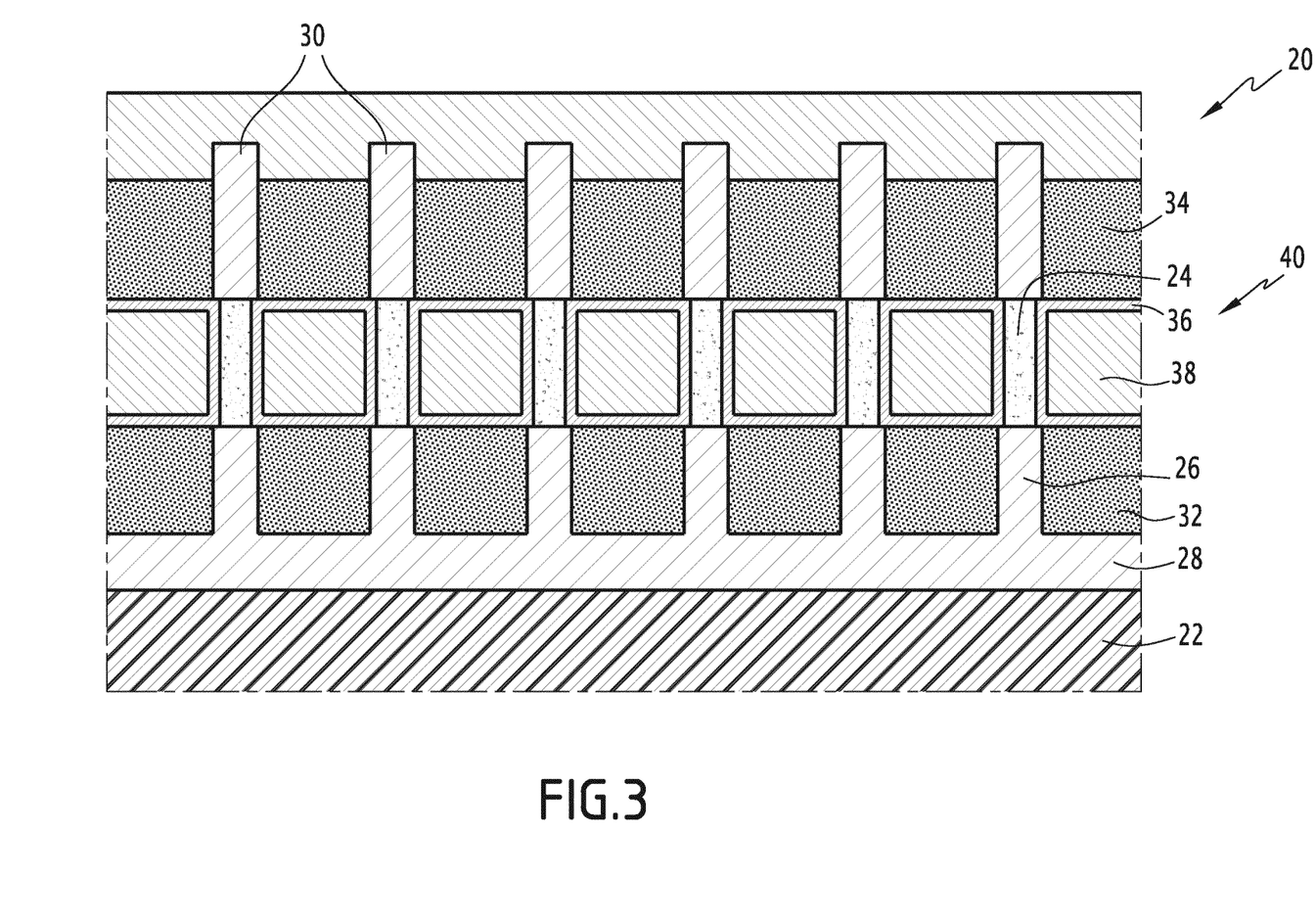
FIGS. 3 and 4 are respectively cross-sectional and profile diagrammatic illustrations of an electronic device according to the invention, comprising a field-effect transistor, integrated on a network of vertical nanowires.

In FIG. 3, an electronic device 20 according to the invention comprises field-effect transistors 2 implemented/integrated on vertical nanowires from elementary transistors as shown in FIGS. 1 and 2.

The electronic device 20 includes a substrate 22, for example made from silicon, and a network of vertical nanowires 24, the nanowires being arranged regularly on the substrate 22 and preferably in two dimensions.

Each nanowire is made from a material of group IV, such as silicon Si, Ge, etc. or groups III-V, for example InAs, GaAs, etc. according to the periodic table of elements.

Each nanowire 24 is preferably made from silicon.

The end of each nanowire 24 across from the substrate 22 is called the nanowire foot and includes a so-called "bottom" or source contact 26 of the transistor as previously described. All of the source contacts 26 are the same length and are connected by a layer 28 of material so as to form an extension for a single contact or source electrode for the electronic device 20, for a subsequent connection.

Likewise, the end opposite the substrate 22 of each nanowire 24 is called the nanowire head and includes a so-called "top" or drain contact 30 of a transistor as previously described. All of the drain contacts 30 are the same length and are connected by a layer so as to form an extension for a single contact or drain electrode for the electronic device 20, for a subsequent connection.

The source contacts 26 are separated from each other by an insulating layer 32, and likewise, the drain contacts 30 are separated from each other by another insulating layer 34.

Each nanowire 24 is surrounded by a gate formed on a first layer of dielectric material 36 called "gate dielectric" surrounding a portion of each nanowire, and a layer of conductive material 38 called "gate conductor" around each layer of dielectric material surrounding the portion of each nanowire.

The layer of gate dielectric material 36 surrounding the portion of each nanowire is preferably made from silicon dioxide $SiO_2$ or an insulating material having a high dielectric constant among, for example, oxides with a base of aluminum (Al), zirconium (Zr), gadolinium (Gd) or hafnium (Hf).

The conductive material creating the gate electrode is preferably made from metal, silicide, silicon or polysilicon.

All of the second gate conductor layers 38 are connected to each other so as to form a single layer of conductive material "embedding" the nanowires to form an extension for a single contact or gate electrode of the electronic device 20, for a subsequent connection.

The thickness of the layer of conductive material corresponds to the length of the gate of the transistor device.

Preferably, the gate length of the transistor is smaller than 30 nm.

The extension of the drain is angularly offset, preferably by 90°, with respect to the extension of the gate, which in turn is angularly offset by 90° with respect to the extension of the source so as to minimize the overlap area respectively between the contact of the gate and the contact of the drain and between the contact of the gate and the contact of the source, and to thereby minimize the parasitic capacitances.

The source and drain electrodes are positioned symmetrically with respect to the gate electrode of each transistor implemented on a nanowire.

Preferably, the insulating or dielectric layers 32 and 34 are fabricated from the same material, for example with a base of silicon oxide (SiO), silicon nitride (SiN) or polymer such as, for example, poly(methyl methacrylate) (PMMA), polydimethylsiloxane (PDMS), SU-8 resin.

These dielectric layers 32 and 34 are capable of insulating each source and drain electrode to form the contacts between the source and gate and between the drain and gate of each transistor implemented on a nanowire.

The thickness of the first and second layers of dielectric material 32, 34 and therefore the position of the layer of gate conductor material 38 are predefined so that the source and drain electrodes are positioned symmetrically with respect to the gate electrode of each transistor implemented on a nanowire.

According to one alternative, the source and drain electrodes are positioned symmetrically with respect to the gate electrode using an auto-alignment method of the source and drain electrodes on the gate electrode of each transistor implemented around a nanowire.

Figure 4:
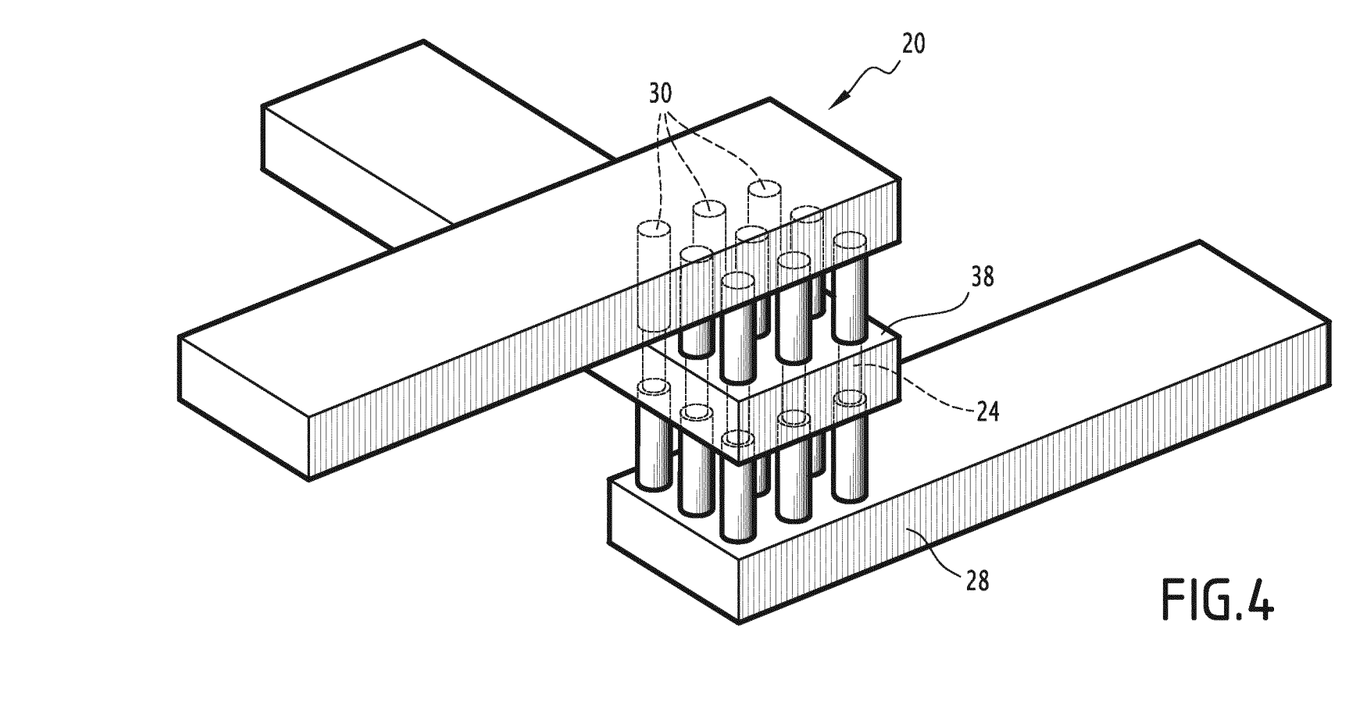

Such a field-effect transistor device 20 on a network of vertical nanowires is shown diagrammatically in profile view in FIG. 4, which shows the network of nanowires 24, the layer 28 of material and the layer 38 of gate conductor material respectively forming the extension/contact of the source and gate of the device 20.

An electronic device according to the invention comprises at least one device with a plurality of field-effect transistors implemented on a network of vertical nanowires as previously described.

These elementary transistor devices (nFET and pFET) can for example be used to produce logic circuits, such as CMOS inverters.

According to other alternatives, these electronic devices belong to the group consisting of: a CMOS inverter, a multiplexer, a volatile memory and a non-volatile memory, a device for detecting gases or biochemical agents.

A processor according to the invention includes at least one electronic device as previously described.

Figure 5:
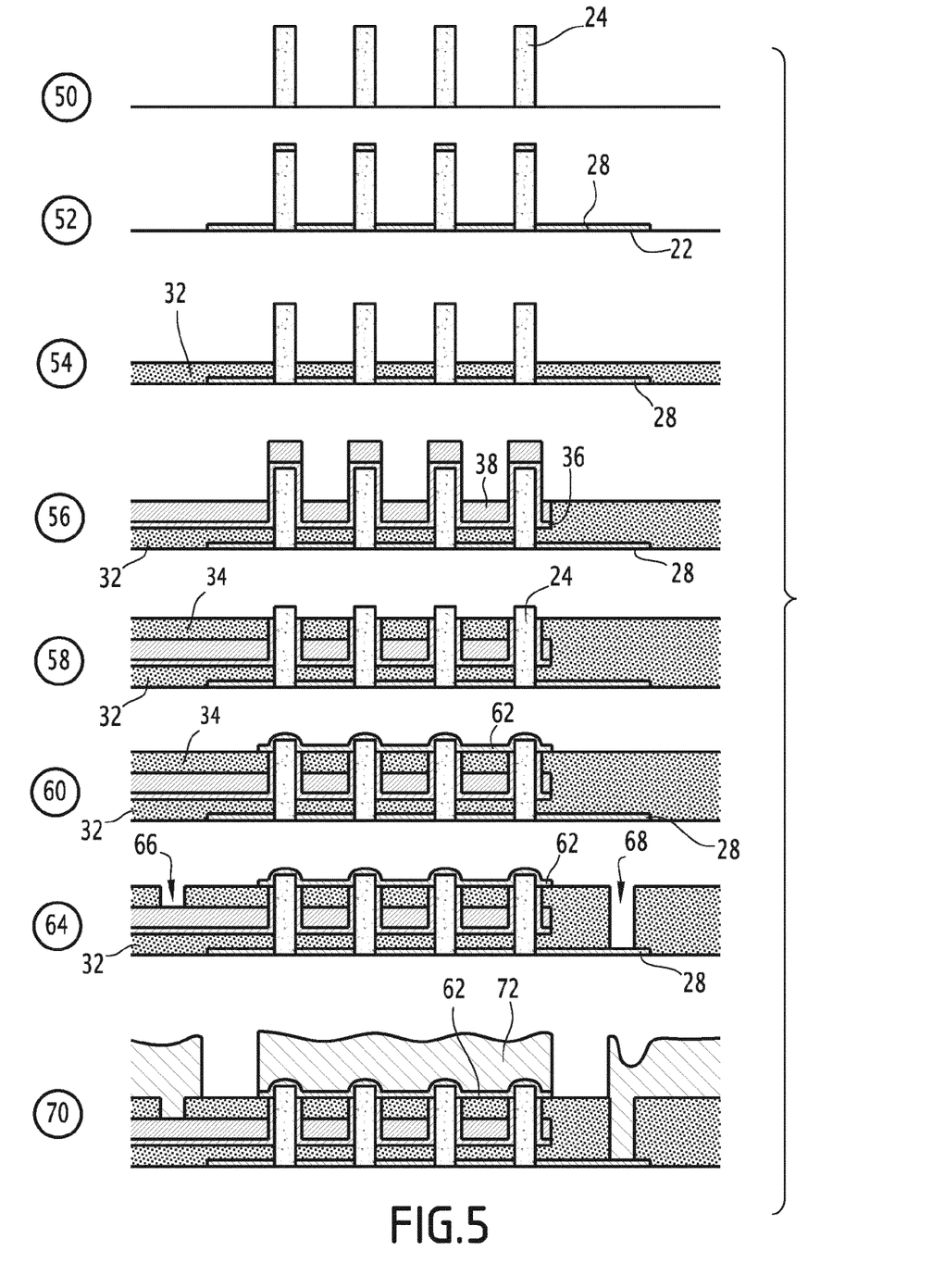
FIG. 5 is a diagrammatic illustration of the fabrication process according to the first embodiment of the invention.

The fabrication process for the electronic device 20 will now be described using FIG. 5.

The fabrication process begins by producing 50 a network of nanowires 24.

The nanowires 24 are made from a material in group IV, such as silicon (Si), germanium (Ge), etc. or groups III-V, for example InAs, GaAs, etc. according to the periodic table of elements.

Preferably, the nanowires 24 are made from a silicon (Si) semiconductor material.

Furthermore, the nanowires are preferably formed using the top-down approach, for example by etching.

According to one alternative, the nanowires are formed using the bottom-up approach, for example by growth.

In 52, the method continues by the anisotropic deposition of a layer 28 of source contact material on the substrate 22. The metal is then at the heads and feet of each of the nanowires.

This material is a metal chosen as a function of the material of the nanowires. For example, for silicon, contacts are made with a low Schottky barrier height by using so-called "band edge metals" (Platinum Pt for type p and rare earth Erbium (Er) or Ytterbium (Yb) for type n), or contacts with a base a the material close to half the gap of the silicon (Ni, Ti, Co, etc.). A heat activation makes it possible to diffuse the metal in the wire and form a silicide that makes it possible to reduce the contact resistance. If the wires have a base from III-V, contacts are used with a base of Palladium/Germanium (Pd/Ge), Ni, Titanium/Gold (Ti/Au) as well as contacts that can be diffused by heat activation.

Figure 6:
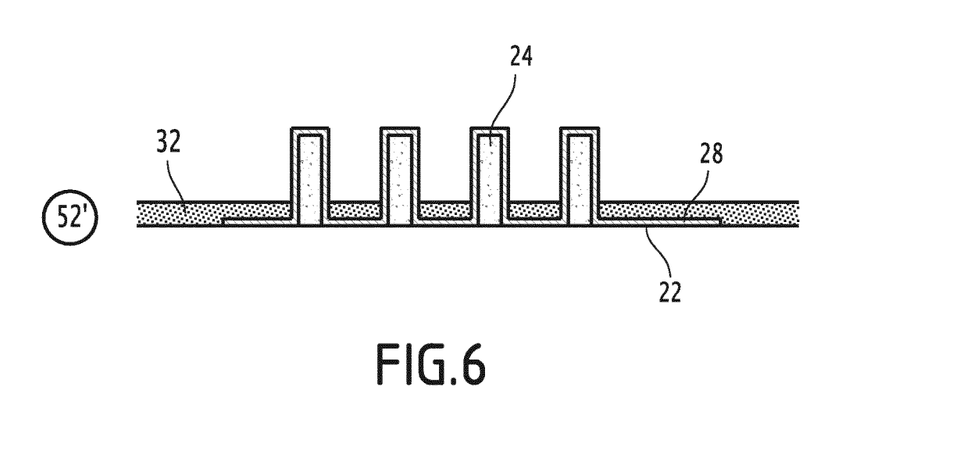
FIG. 6 is a diagrammatic illustration of one alternative of a step of the fabrication process illustrated in FIG. 5.

According to an alternative illustrated in FIG. 6, the deposition is isotropic, step 52'. In that case, the same thickness of metal is deposited on the feet, on the side walls of the nanowires and on the head of the wires. Masking by planarization makes it possible to selectively etch the metal on the walls of the nanowire without etching the metal at the foot of the nanowire.

The fabrication process continues, in 54, with a step for forming a first insulating layer 32, also called planarization step. After forming the insulating layer 32, the metal on the top of the wires is selectively etched.

This first insulating layer 32 is made from a dielectric material preferably with a low dielectric constant so as to minimize the overlap capacitances.

For example, this first insulating layer 32 is made from a fluent inorganic resin, such as hydrogen silsesquioxane (HSQ), the chemical structure of which makes it similar to a silicon oxide $SiO_x$.

During this step 54, the first insulating layer 32 is deposited so as to cover everything, i.e., at least the entire layer 28 of source contact material and part of the substrate 22.

Such a layer of silicon oxide $SiO_x$ is deposited or coated on the network of nanowires by spin coating, then annealed at a temperature of 100° C. so as to evaporate the solvents present in that layer, making it possible to completely "embed" the network in the first insulating layer 32 and thereby greatly limit the wave effect.

According to one alternative, this deposition is done using other known deposition techniques, such as chemical vapor deposition (CVD) or physical vapor deposition (PVD). Then, the first insulating layer 32 is thinned using a technique such as chemical or plasma etching or a combination of those two techniques.

According to one alternative, the first insulating layer 32 is thinned using a mechanochemical polishing technique at the upper level of the nanowires, then chemically and/or plasma etched.

The fluency of the material making up the first insulating layer 32 is substantially comprised between 0.1 and 3 cSt, i.e., between $1.10^{-7}$ and $3.10^{-6}$ m$^2$/s; for example, it is equal to 0.6 cSt for hydrogen silsesquioxane (HSQ) then allowing a spin deposition to obtain excellent flatness of the layer, in particular above the network of nanowires 24. The level difference or flatness of the first insulating layer 32 is thus defined with a precision substantially less than or equal to 5 nm.

This excellent flatness coupled with the controlled etching (plasma and/or wet) makes it possible to position the surface of the first insulating layer 32 at a desired and precise height of the nanowires 24 of the gate 10 around each nanowire 24.

Using a solution of hydrofluoric acid extremely diluted in water at 1:1000 makes it possible to control the etching speed precisely, preferably substantially equal to 1 Angström/s, and therefore the position/height of the surface of the first insulating layer 32 while preserving a very low surface roughness identical to the roughness of the surface of the first insulating layer 32 before etching, without wave effect.

For example, a first insulating layer 32 has been produced with a height of 110 nm with a precision substantially equal to 1 nm for a network of silicon nanowires with a diameter of 25 nm and a length of 220 nm.

The fabrication process then continues with the deposition, in 56, of the gate oxide 36 or gate dielectric conformally, then the deposition of a gate conductor or metal 38.

The deposition of the gate oxide is done by atomic layer deposition (ALD) or chemical vapor deposition (CVD) for an insulator having a high dielectric constant, i.e., greater than 5, or by thermal oxidation for $SiO_2$.

Physical vapor deposition makes it possible to anisotropically deposit a thin layer of metal 38 on the surface of the gate dielectric 36 thus obtained. The thickness of the thin layer of gate metal 38 is substantially less than 30 nm.

In 58, a second insulation or planarization step is carried out so as to form the second insulation layer 34. This layer is similar to the step 54 described above and will therefore not be described here.

The second insulation step is followed by a step for selective etching of the gate oxide 36 and the gate conductor 38 situated at the head of the nanowires 24 so as to free the upper face of the nanowires 24 designed to form the electrode or drain contact of the transistors implemented on each of the nanowires 24 of the transistor device.

The fabrication process continues by the deposition, in 60, of a layer 62 forming drain contacts 62; preferably, the layer 62 is a metal identical to that making up the layer 28 forming the source contact.

The fabrication process continues traditionally through a so-called "backend" interconnect formation process including a step for creating, in 64, holes or vias 66, 68 in the second insulating layer 34 and the first insulating dielectric layer 32, respectively, so as to connect the extension/gate electrode 38 and the extension/electrode of the contact of the foot of the nanowires 24, i.e., the electrode of the source contact 28.

The backend process further includes a step 70 for depositing a metal 72, called backend metal, to produce the contact between the extension of the gate and the extension of the source on the one hand, and the extension of the drain on the other hand. The thickness of the metal layer 72 is substantially equal to twice the thickness of the depth of the holes/vias so as to fill them and define the extrinsic contacts of the drain 62 (head of the nanowires), the source 28 (foot of the nanowires) and the gate 38.

Figure 7:
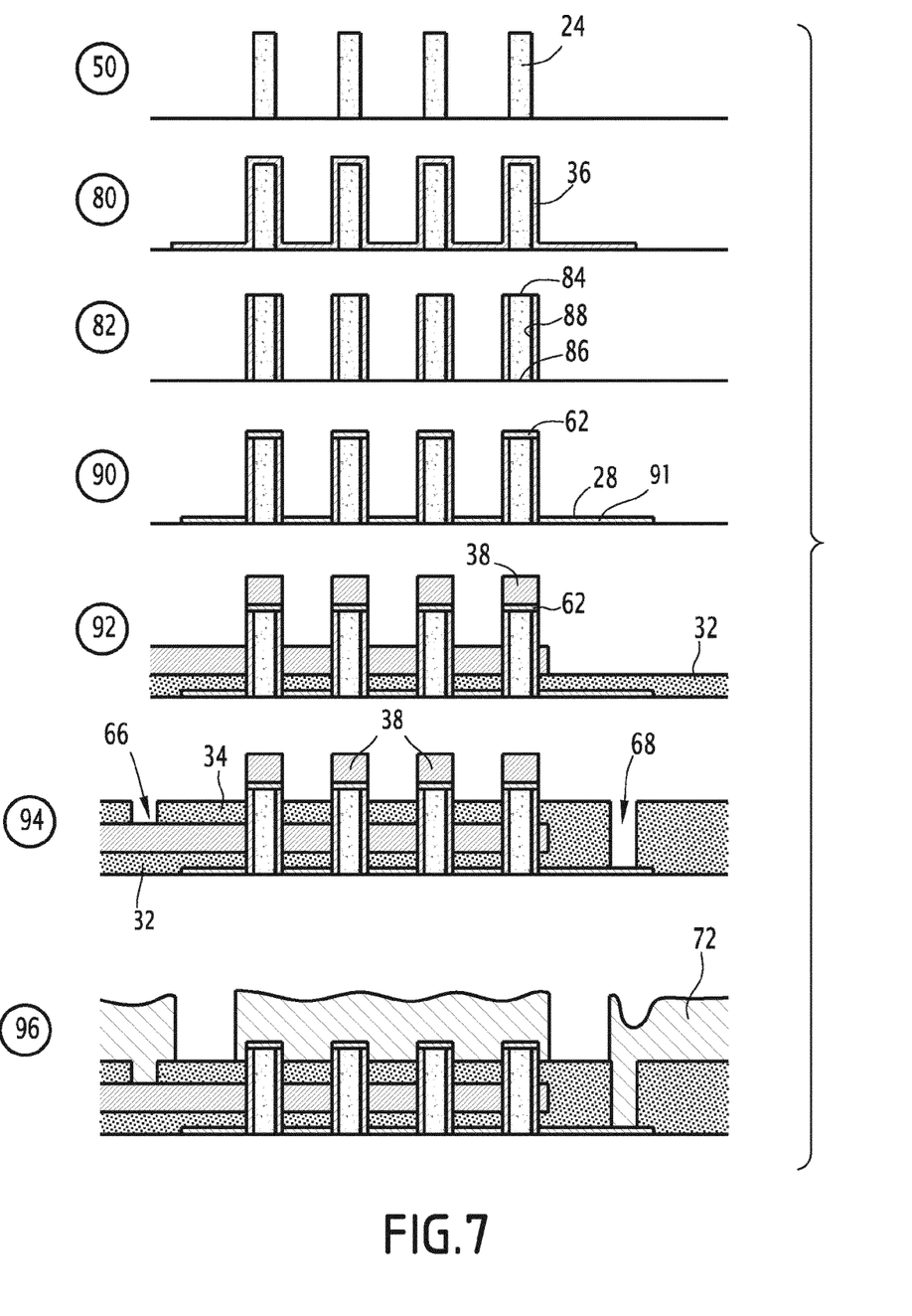
FIG. 7 is a diagrammatic illustration of the fabrication process according to another embodiment of the invention.

A second embodiment of the fabrication process will now be described in light of FIG. 7.

The fabrication process begins using the same step 50 for producing a network of nanowires 24.

It continues with a step 80 for depositing the gate oxide 36 or dielectric conformally. The deposition of the gate oxide is done using atomic layer deposition (ALD) or chemical vapor deposition (CVD) for an insulator having a high dielectric constant, i.e., greater than 5, or by thermal oxidation in the case of an SiO-based dielectric.

Then, in 82, anisotropic etching of the gate dielectric 36 is done to free the heads 84 and feet 86 of the nanowires 24 while preserving the gate dielectric 36 on the side walls 88 of the nanowires.

The fabrication process continues through a deposition 90 of a layer of source contact 28 and drain contact 62 material; preferably, the material called source/drain contact material is a metal. It is deposited anisotropically, for example by physical vapor deposition (PVD), so as to cover the head 84 and the feet 86 of the nanowires 24 while forming an extension 91 to receive the connection to the source contact 28. Depending on the metal and the material chosen for the nanowire, a heat activation as previously described may be done.

In 92, an insulation step between the source and the gate is done by depositing a first insulating layer 32, also called planarization step. Such a step has already been described and will therefore not be described here.

This insulation and planarization step is designed to position the upper surface of the first insulating layer 32 and thus the gate conductor layer at the desired height, as explained in the previous embodiment.

The insulation and planarization step is followed by a step for depositing the gate conductor 38, preferably a metal, for example chrome (Cr), titanium nitride (TiN), tantalum nitride (TaN), tungsten (VV), etc. so as to form the gate coating the nanowires 24. The deposition is done anisotropically. The thickness of deposited metal corresponds to the gate length Lg of the transistor.

According to one alternative, the metal is deposited anisotropically following a planarization and selective etching step as previously described.

Thus, the nanoscale gate lengths are made without using a final lithography technique.

The metal deposition also makes it possible to form an extension of the layer forming the gate of the transistor device, designed to receive a connection to the gate contact access. This extension is angularly offset by 90° with respect to the extension of the source so as to minimize the overlap area between the gate contact and the source contact, and consequently the parasitic capacitances.

This overlap area being limited to the active part of the transistor, a higher density of nanowires makes it possible to decrease the surface of the overlap area.

The fabrication process continues through a second insulation/planarization step so as to form a second insulating layer 34. This planarization step is similar to the step 58 of the previous embodiment and will therefore not be described here.

This planarization step is followed by a selective etching step of the gate metal 38 situated at the head of the nanowires 24 so as to open the contact of the head of the nanowires 24, designed to be the drain contact, still offset by 90° with respect to the previous one.

The fabrication process continues traditionally using a so-called "backend" method including a step 94 for creating holes or vias 66, 68 in the second dielectric insulating layer 34 and the first dielectric insulating layer 32, respectively, so as to connect the extension/gate electrode 38 and the extension/contact electrode of the foot of the nanowires 24, i.e., the electrode of the source contact 28.

The backend method further includes a step 96 for depositing a so-called backend metal 72 to produce the contacts between the extension of the gate and the extension of the source on the one hand, and the extension of the drain on the other hand. The thickness of the metal layer 72 is substantially equal to twice that of the depth of the holes/vias so as to fill them and define the extrinsic contacts of the drain 62 (head of the nanowires), the source 28 (foot of the nanowires) and the gate 38.

Figure 11:
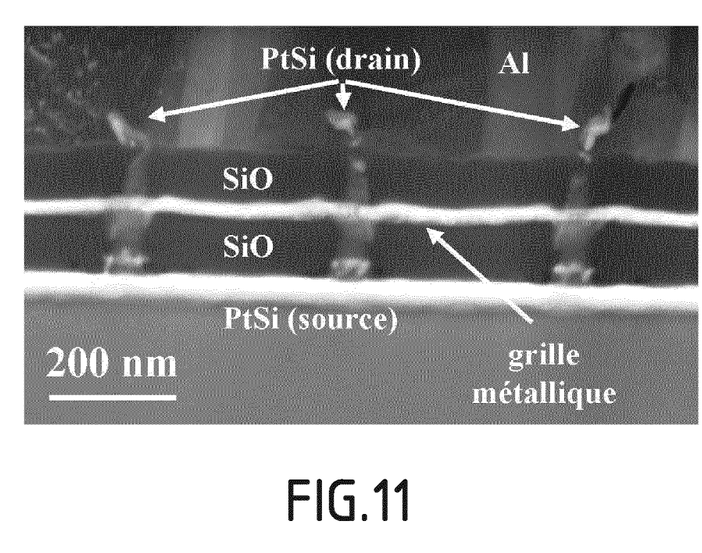
FIGS. 11 and 12 are images of example embodiments of devices according to the invention.

FIG. 11 is a cross-sectional view done by STEM (scanning transmission electron microscopy) of a vertical FET device on a network of silicon nanowires with an ultra-short coating gate (15 nm) and PtSi siliconized source/drain areas.

Figure 8:
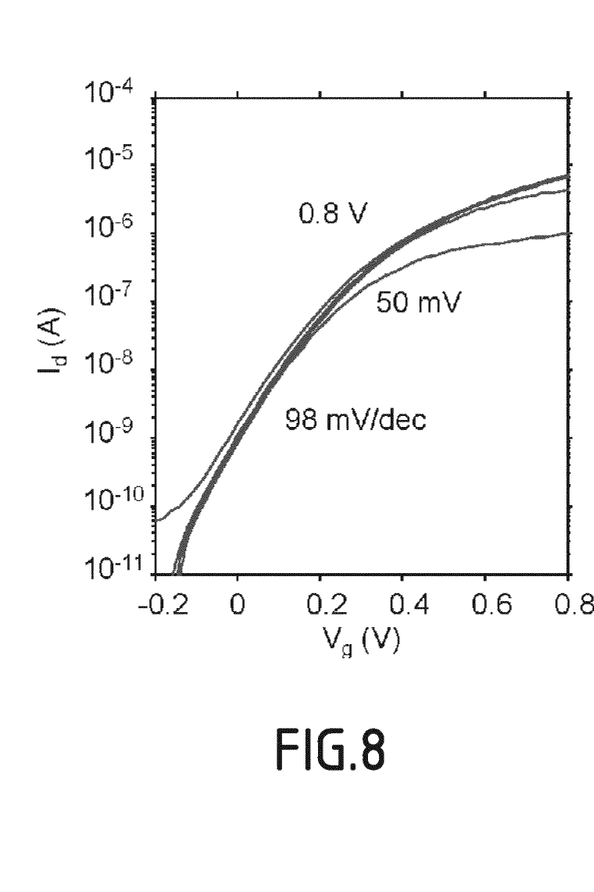
FIGS. 8 and 9 are sets of curves showing the evolution of the drain current respectively as a function of the polarization voltage of the gate electrode and as a function of the polarization voltage of the drain electrode for a transistor device of the pFET type according to the invention.
Figure 9:
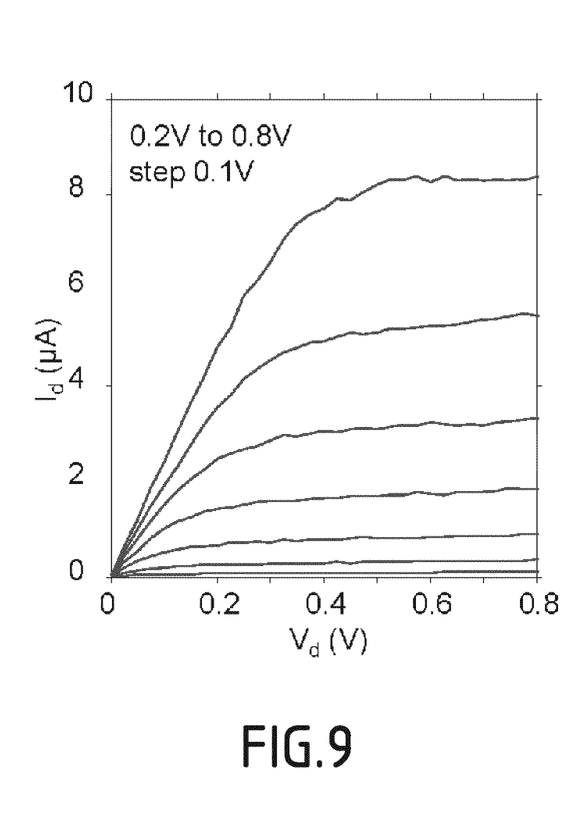

FIGS. 8 and 9 illustrate a static characterization obtained for a field-effect transistor device implemented on a network of vertical nanowires, here a pFET with a gate 15 nm long on a network of 81 wires with a diameter of 18 nm each as observed in FIG. 11. Furthermore, the gate oxide of this pFET transistor device is $SiO_2$ ($\kappa=3.9$).

In light of FIG. 8, the operation of the transistor device is excellent considering its extreme dimensioning. The control of short channel effects is very good with a slope under the threshold of 98 mV/decade, a drain induced barrier lowering (DIBL) of 8 mV and an $I_{on}/I_{off}$ ratio close to 5 decades. The polarization voltage, $V_{DD}=0,8V$, is consistent with the technology.

It must be noted that the nanowires are not intrinsically doped (as in traditional thin layer technologies), but with a fairly high uniform level (~$8.10^{18}$ atoms/cm for the characterized pFET transistor device).

The electrostatic control of the channel is not done when small enough diameters of the nanowires are produced, for example diameters substantially equal to 30 nm. In that case, the diameter of the wires is decreased in proportion with the length of the gates. The loss of control of the channel amounts to a clear deterioration of the slope under the threshold and an increase of the current in the off state. This phenomenon is visible for diameters larger than 30 nm.

Furthermore, the high uniform doping offers the advantage of low access resistance both at the metal/semiconductor contact (ohmic contact) and at the resistance of the wire up to the gate (space or resistance in the conventional technology).

Furthermore, the fabrication process is simplified as a result. In fact, there is no auto-aligned gate structure and no specific doping of source/drain zones.

Figure 10:
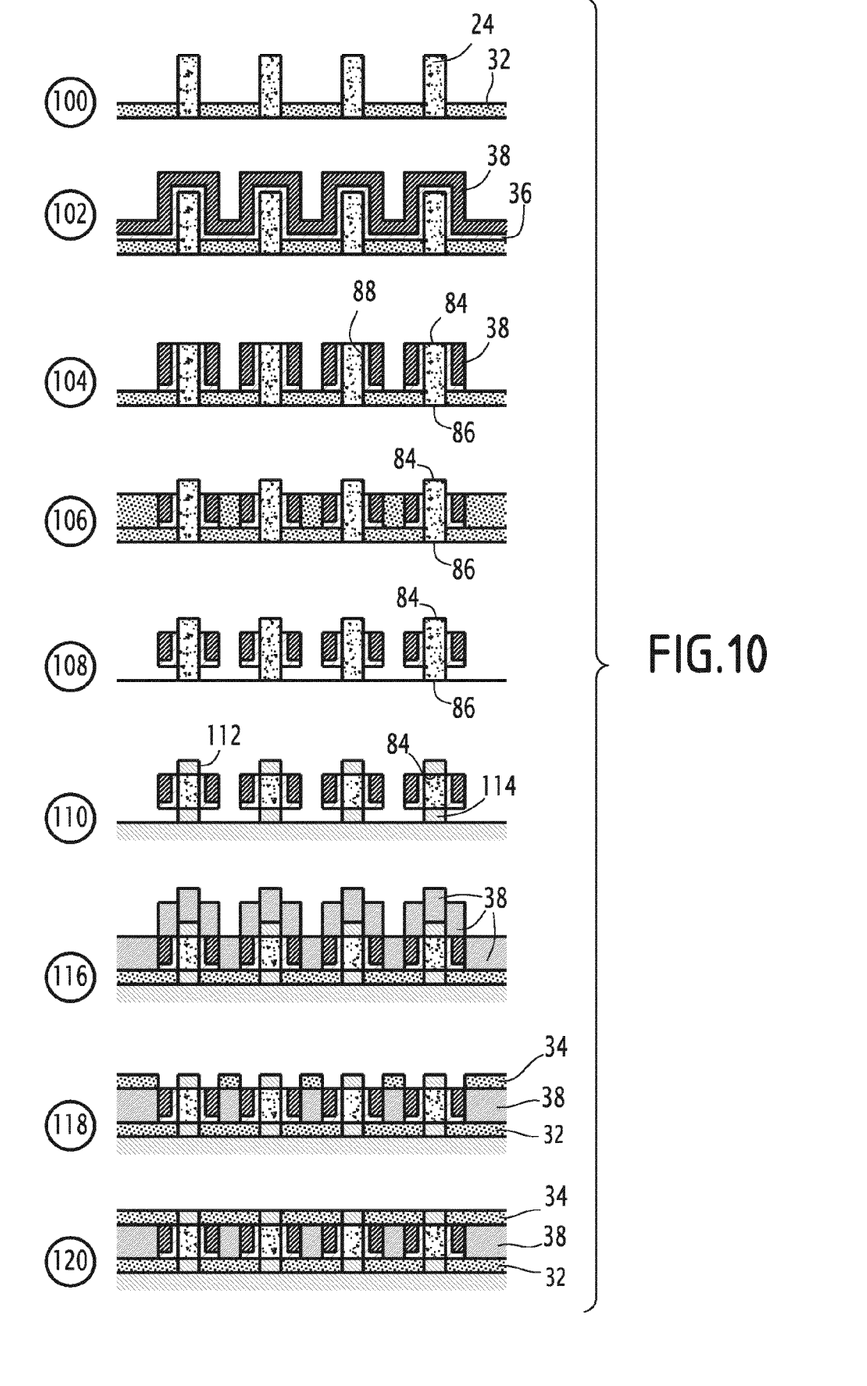
FIG. 10 is a diagrammatic illustration of the fabrication process according to a third embodiment of the invention.

A third embodiment is described in light of FIG. 10, in order to fabricate a FET transistor device implemented on a network of vertical nanowires in which the source and drain zones are aligned with a nanoscale gate surrounding each nanowire. In fact, by masking an area shared by all of the wires so as to expose only the foot of the nanowires or the foot and the head of the nanowires, a doped or auto-aligned metal area is produced on the masked area, i.e., the gate.

The fabrication process begins with a step (not shown) for forming the network of vertical nanowires 24 as described above.

The process continues by depositing 100 an insulating/dielectric layer 32 and a step for planarizing one third of the height of the nanowires.

In 102, the gate stack is formed by a dielectric, for example an insulating layer (36) with a high dielectric constant κ and a fine layer of gate metal or polysilicon. These two depositions are done conformally by ALD or CVD.

Figure 12:
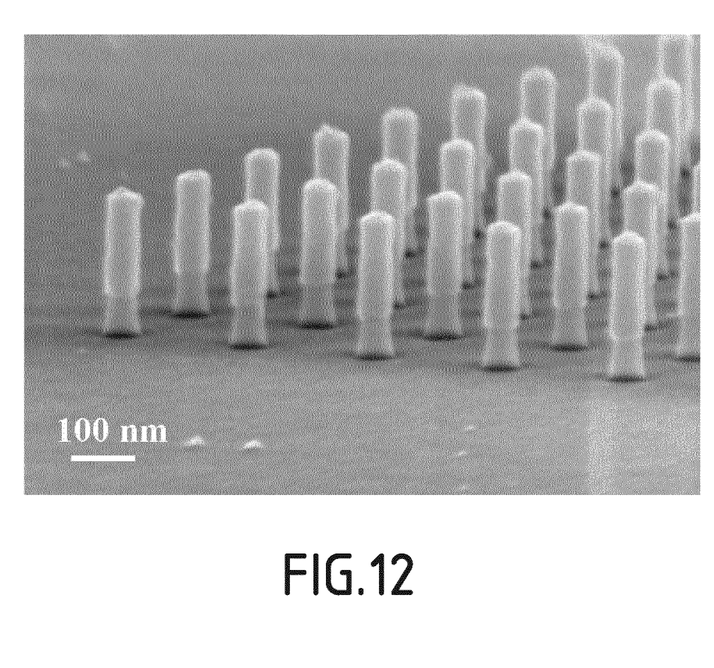

In 104, an anisotropic etching step of said gate stack 38, 36 makes it possible to remove the thickness of material present on the insulating layer 32 without etching the layer covering the side walls of the nanowires 24. At this stage, the selective etching of the insulating layer 32 makes it possible to obtain masking of the upper part of the nanowires of the network as observed in FIG. 12. This is an image obtained by scanning electron microscopy of a network of metal wires made from Si with a gate stack, i.e., an insulator with a high dielectric constant κ and a conductive layer of polysilicon, which coats the upper part of the nanowires leaving their feet free, after etching of the planarization insulator.

In 106, a second insulation deposition and planarization step is carried out. This step 106 makes it possible to define the length of the gate by the thickness of the second insulating layer.

Then, a step for isotropic etching of the layers 36, 38 is done so as to "remove" the layers of material 36, 38 to cover the upper part of each nanowire without etching the part protected by the second planarization.

In 108, the selective etching of the insulator/planarization dielectric makes it possible to free access to the foot, for example the source, of the nanowires, thereby producing the nanoscale gate stack located in the middle of the height of the nanowires and thereby making it possible to define auto-aligned source/drain areas on that structure.

The fabrication process continues in 110 by a step for defining auto-aligned source/drain areas on the gate. In fact, during the formation of the sources/drains, the gate serves as masking so that those two source/drain areas are perfectly aligned.

In 110, a step for doping the conformed auto-aligned source 114 and drain 112 is carried out, for example by plasma or doped fluent resin. Thus, the source 114 and the drain 112 are perfectly auto-aligned on the gate already defined.

According to one alternative, step 110 is a step for source/drain selective diffusive metallization. This step comprises depositing an isotropic metal by CVD or ALD, then heat activation, making it possible to react the metal in contact with the semiconductor. Selective etching of the nonreactive metal makes it possible to obtain the source or the metal drain perfectly aligned on the gate. For nanowires made from a material in group IV, this step is called siliconizing (Si) or germaniumization (Ge), but may also be developed using III-V.

Furthermore, this siliconizing step may be combined with the described doping step.

The fabrication process continues in 116 by planarization of the insulation up to the foot of the gate, then deposition of a gate conductor, preferably a metal, to connect all of the (preformed) gates to each other. This metal is identical to the gate metal.

According to one alternative, this metal is different from the gate metal.

In 118, another step for depositing an insulating layer followed by a planarization and selective etching of the gate conductor, located at the head of the wire and on the gate, is done.

Then, in 120, a last planarization step is done to insulate the gate from the drain and thereby free the head of the wires for the backend step.

The process ends in a known manner using a backend process as previously described.

The fabrication process according to the invention makes it possible to fabricate FET transistor devices implemented on a network of vertical nanowires having a nanoscale conductive gate, coating each nanowire, thereby making it possible to control the passage of the current in the channels.

Furthermore, it makes it possible to fabricate transistors whereof the source and the drain are symmetrical with respect to the gate. In fact, according to the first two embodiments, the symmetry is due to the precision of the thinning/planarization of the insulation layers by etching, the two insulating layers having to have the same thickness. In the third embodiment of the process, the gate is formed first, since the source and drain areas are perfectly auto-aligned on the gate.

Furthermore, for hyperfrequency applications, it is essential to minimize the gate/source and gate/drain parasitic overlap capacitances, which is obtained using the fabrication process according to the invention.

The transistor device according to the invention makes it possible to adjust several levers:
  the decrease of the overlap surface, which is related to the possibility of implementing very dense networks,
  using material with a very low dielectric constant, for example a low density oxide with a dielectric constant close to 2.7, and
  increasing the distance between the gate and the top and bottom (source/drain) contacts.

Advantageously, the fabrication process according to the invention only uses techniques/technologies existing in microelectronics. Furthermore, it makes it possible to provide a credible solution for the fabrication of field-effect nanodevices whereof the dimensions are very small without, however, using elements of new machines or incurring high costs, such as using ultimate lithography.

Thus, the fabrication process making it possible to produce nanoscale gates is easily transposable to larger dimensions (microns) for detection applications.

Furthermore, the process is compatible and flexible with the different research and development avenues currently being pursued, such as integration on different nanowire materials, three-dimensional integration, electronics on flexible substrate, etc.

Additionally, the fabrication process makes it possible to optimize the foot and head contacts, called source/drain, thereby proposing a low access resistance as well as low overlap capacitances.

Advantageously, these different embodiments of the fabrication process according to the invention are compatible with the fabrication of elementary logic circuits, for example such as CMOS inverters.

In fact, to produce a purely silicon version, it suffices to define two boxes (type n and type p) with uniform doping, for example of approximately $10^{19}$ impurities/cm$^2$, and then to produce two networks of nanowires using the top-down method. The two devices (nFET et pFET) are then made in parallel following the process according to the invention previously described, more simply interconnected using a via technology and traditional metallization.

This fabrication process may be used with networks of nanowires made from different materials, since the process is generic. For example, it is possible to produce networks of III-V nanowires for type n associated with nanowires made from Ge or Si for type p, or even to make the nFET and pFET on III-V networks.

The invention claimed is:

1. A fabrication process for fabricating a field-effect transistor device implemented on a network of vertical nanowires, including a plurality of elementary transistors, each elementary transistor including a source electrode positioned at one end of a vertical nanowire of the network and a drain electrode positioned at an opposite end of the vertical nanowire of the network and connected by a channel, each elementary transistor including a gate electrode surrounding each vertical nanowire of the network, the drain, source and gate electrodes of the elementary transistors implemented on the nanowires being respectively connected to each other so as to form unique drain, source and gate electrodes of the transistor device, the fabrication process comprising the following steps:
  forming each of the vertical nanowires;
  producing the source electrode at the one end of each previously-formed vertical nanowire and the drain electrode at the opposite end of the previously-formed vertical nanowire, the source and drain electrodes being positioned symmetrically with respect to the gate electrode of each elementary transistor implemented on the previously-formed nanowire;
  creating a gate electrode by depositing a layer of dielectric material surrounding a portion of each previously-formed nanowire and depositing a layer of conductive material around each layer of the dielectric material surrounding the portion of each previously-formed nanowire, the layer of conductive material being unique for all of the previously-formed nanowires of the network and the thickness of the layer of conductive material corresponding to the length of the gate of the transistor device; and
  insulating each of the drain, source, and gate electrodes using a planar layer of a dielectric material so as to form a nanoscale gate and insulate the contacts between the source and the gate and between the drain and the gate of each elementary transistor implemented on the previously-formed nanowire.

2. The fabrication process according to claim 1, wherein the source and drain electrodes are positioned symmetrically with respect to the gate electrode using an auto-alignment process of the source and drain electrodes on the gate electrode of each transistor implemented around the previously-formed nanowire.

3. The fabrication process according to claim 1, wherein the step for insulating each source and drain electrode using the dielectric is done by depositing a first layer of the dielectric material and a second layer of dielectric material, the layer of conductive material creating the gate electrode being deposited above the first layer of dielectric material and the second layer of dielectric material being deposited above the layer of conductive material creating the gate electrode, the thickness of the first and second layers of dielectric material and the position of the layer of conductive material creating the gate electrode being predefined so that the source and drain electrodes are positioned symmetrically with respect to the gate electrode of each transistor implemented on the previously-formed nanowire.

4. The fabrication process according to claim 3, wherein the flatness of the first layer of dielectric material is defined with a precision substantially less than or equal to 5 nm.

5. The fabrication process according to claim 3, wherein the dielectric material of the first and second layers of dielectric material is a fluent inorganic resin.

6. The fabrication process according to claim 1, wherein the thickness of the layer of conductive material creating the gate electrode is smaller than 20 nm, the thickness of the layer defining the length of the gate.

7. A fabrication process for fabricating a field-effect transistor device implemented on a network of vertical nanowires, including a plurality of elementary transistors, each elementary transistor including a source electrode positioned at one end of a vertical nanowire of the network and a drain electrode positioned at an opposite end of the vertical nanowire of the network and connected by a channel, each elementary transistor including a gate electrode surrounding each vertical nanowire of the network, the drain, source and gate electrodes of the elementary transistors implemented on the nanowires being respectively connected to each other so as to form unique drain, source and gate electrodes of the transistor device, the fabrication process comprising the following steps:
  producing the source electrode at the one end of each previously-formed vertical nanowire and the drain electrode at the opposite end of the previously-formed vertical nanowire, the source and drain electrodes being positioned symmetrically with respect to the gate electrode of each elementary transistor implemented on the previously-formed nanowire;
  creating a gate electrode by depositing a layer of dielectric material surrounding a portion of each nanowire and depositing a layer of conductive material around each layer of the dielectric material surrounding the portion of each nanowire, the layer of conductive material being unique for all of the nanowires of the network and the thickness of the layer of conductive material corresponding to the length of the gate of the transistor device; and
  insulating each of the drain, source, and gate electrodes using a planar layer of a dielectric material so as to form a nanoscale gate and insulate the contacts between the source and the gate and between the drain and the gate of each elementary transistor implemented on the previously-formed nanowire,
  wherein the step for insulating each source and drain electrode using the dielectric is done by depositing a first layer of the dielectric material and a second layer of dielectric material, the layer of conductive material creating the gate electrode being deposited above the first layer of dielectric material and the second layer of dielectric material being deposited above the layer of conductive material creating the gate electrode, the thickness of the first and second layers of dielectric material and the position of the layer of conductive material creating the gate electrode being predefined so that the source and drain electrodes are positioned symmetrically with respect to the gate electrode of each transistor implemented on the previously-formed nanowire.

* * * * *